United States Patent [19]
Chan et al.

[11] Patent Number: 6,137,429
[45] Date of Patent: Oct. 24, 2000

[54] CIRCUIT AND METHOD FOR ATTENUATING NOISE IN A DATA CONVERTER

[75] Inventors: Joseph Y. Chan; David Yatim, both of Austin; Kiyoshi Kase, Pflugerville; Paul Astrachan, Austin, all of Tex.

[73] Assignee: Motorola, Inc., Schaumburg, Ill.

[21] Appl. No.: 09/265,238

[22] Filed: Mar. 8, 1999

[51] Int. Cl.[7] .................................................. H03M 3/00
[52] U.S. Cl. ......................................... 341/143; 341/155
[58] Field of Search .................................... 341/143, 144, 341/155

[56] References Cited

U.S. PATENT DOCUMENTS

| | | | |
|---|---|---|---|
| 5,134,402 | 7/1992 | Miyoshi | 341/144 |
| 5,206,648 | 4/1993 | Yukawa | 341/143 |
| 5,323,157 | 6/1994 | Ledzius et al. | 341/143 |
| 5,357,252 | 10/1994 | Ledzius et al. | 341/143 |
| 5,373,293 | 12/1994 | Hirata | 341/118 |
| 5,608,401 | 3/1997 | Viswanathan et al. | 341/144 |
| 5,682,162 | 10/1997 | Hamasaki et al. | 341/144 |
| 5,847,667 | 12/1998 | Baek | 341/101 |

*Primary Examiner*—Peguy Jean Pierre
*Attorney, Agent, or Firm*—Anthony M. Martinez

[57] ABSTRACT

A data converter (10) and a method for attenuating noise in an output signal generated by the data converter (10). The data converter (10) includes a sigma-delta modulator (16), a digital-to-analog converter (17), a clock generator (19) connected to the digital-to-analog converter (17), and a clock control circuit (18) connected to the clock generator (19). The clock control circuit (18) enables or disables the clock generator (19) in accordance with the single-bit digital signal to cause a notch characteristic in the output signal for attenuating noise in the output signal.

19 Claims, 2 Drawing Sheets

6,137,429

CIRCUIT AND METHOD FOR ATTENUATING NOISE IN A DATA CONVERTER

FIELD OF THE INVENTION

This invention relates, in general, to data converters and, more particularly, to sigma-delta digital-to-analog converters.

BACKGROUND OF THE INVENTION

There are two basic techniques used in data converters. These are the sigma-delta technique and the resistive or capacitive divider techniques. The sigma-delta technique is attractive because it achieves high resolution by high-frequency timing instead of precisely-matched on-chip components such as resistors. In addition, the expertise needed to produce thin-film, laser-trimmed analog components is difficult to obtain; whereas, high-speed digital switching capability used in sigma-delta modulators is commonplace in the semiconductor industry.

A basic sigma-delta modulator used in a data converter receives an input signal which is summed with inverse feedback of the output signal to provide an error signal. The error signal is processed through a filter to provide the output signal. The sigma-delta modulator shapes quantization noise out of the passband, where it can be filtered.

However, as is well known, sigma-delta modulators can create unwanted tones in the passband. These unwanted tones have frequencies which are linearly related to a DC bias of the input signal. The creation of these unwanted tones is worse for small input signals which are close to the signal ground level. Furthermore, during the time when the input signal is close to the ground level, it is easier for a listener to hear the unwanted tones. One generally accepted explanation of why sigma-delta modulators produce these unwanted tones is that the sigma-delta modulator creates pattern noise in order to resolve small incremental changes in the input signal.

Previous methods for eliminating unwanted tones in the passband included using dithering schemes. However, the implementation of a dither scheme for data conversion is complex. Furthermore, a dither signal affects the overall performance of the data converter such that the signal-to-noise ratio of the data converter is reduced.

Accordingly, it would be advantageous to have a sigma-delta converter which reduces or eliminates unwanted tones in the passband caused by pattern noise. It would be of further advantage for the sigma-delta converter to be area and cost efficient.

DETAILED DESCRIPTION OF THE DRAWINGS

Generally, the present invention provides a data converter circuit and a method for attenuating noise in an output signal generated by the data converter. More particularly, the present invention provides a sigma-delta Digital-to-Analog Converter (DAC) for converting a multibit digital signal to an analog signal, wherein the spectrum of the analog signal is attenuated at a predetermined frequency in order to decrease noise in the output signal. An analog signal is a continuous time varying signal or a discrete signal varying over time with three or more possible states for representing information.

In a preferred embodiment, the sigma-delta DAC includes a sigma-delta modulator, a DAC coupled to the sigma-delta modulator, a clock generator coupled to the DAC, and a clock control circuit coupled to the sigma-delta modulator and the clock generator. The sigma-delta modulator converts the multibit digital signal to a one-bit or single-bit digital signal. The clock control circuit enables or disables the clock generator in accordance with the single-bit digital signal. In particular, the clock control circuit enables or disables the transmission of the clock signal to the DAC in accordance with the single-bit digital signal to attenuate noise in the frequency spectrum of the analog signal. In this embodiment, the frequency domain characteristic of the output of the sigma-delta DAC is attenuated near Fs/2, which is a frequency equal to one-half of a frequency of a sampling clock of the sigma-delta DAC. By attenuating the energy in the output signal at Fs/2, the sigma-delta DAC virtually eliminates tones caused by pattern noise.

Figure 1:
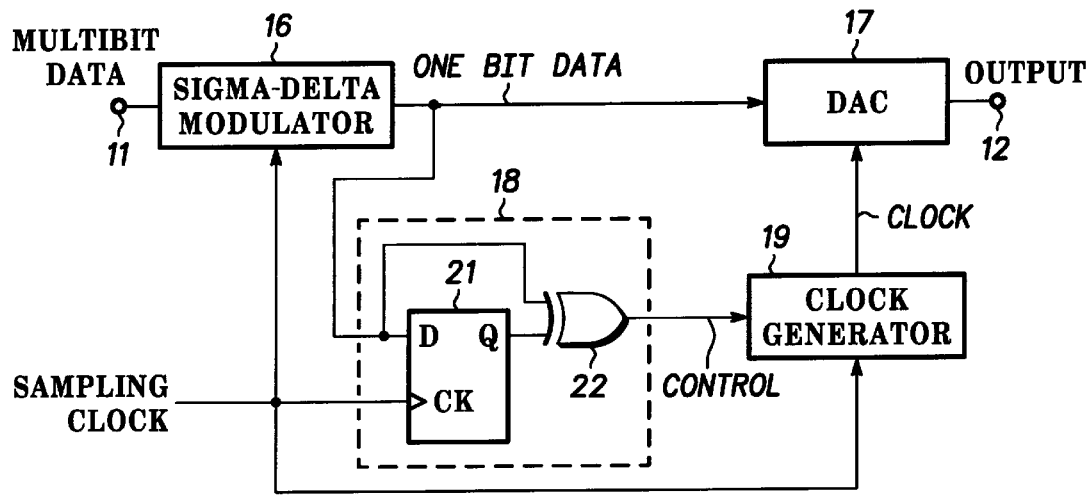
FIG. 1 illustrates a data converter in partial block diagram form and partial schematic form.

FIG. 1 illustrates in partial block diagram form and partial schematic form, a data converter 10 suitable for manufacturing as an Integrated Circuit (IC) using conventional IC processes. Data converter 10 has an input terminal 11 for receiving a multibit digital signal labeled MULTIBIT DATA and an output terminal 12 for providing an analog output signal labeled OUTPUT. Data converter 10, also referred to as a sigma-delta DAC, includes a sigma-delta modulator 16, a DAC 17, a clock control circuit 18, and a clock generator 19. Sigma-delta modulator 16 has a data input terminal for receiving digital signal MULTIBIT DATA, a clock input terminal for receiving a signal labeled SAMPLING CLOCK, and an output terminal for providing a single-bit digital signal labeled ONE BIT DATA.

DAC 17 is a single-bit DAC having a data input terminal for receiving signal ONE BIT DATA, a clock input terminal for receiving a signal labeled CLOCK, and an output terminal for providing signal OUTPUT. Clock control circuit 18 has a data input terminal commonly connected to the output terminal of sigma-delta modulator 16 and to the data input terminal of DAC 17, a clock input terminal for receiving signal SAMPLING CLOCK, and an output terminal for providing a signal labeled CONTROL. Clock generator 19 has a control input terminal connected to the output terminal of clock control circuit 18, a clock input terminal for receiving signal SAMPLING CLOCK, and an output terminal connected to the clock input terminal of DAC 17 for providing signal CLOCK.

When the control input terminal of clock generator 19 is asserted, clock generator 19 is enabled, i.e., the output terminal of clock generator 19 is enabled and a clock signal is provided to the clock input terminal of DAC 17. In other words, signal CLOCK is enabled and one or more pulses are transmitted from the output terminal of clock generator 19 to the clock input terminal of DAC 17. On the other hand, when the control input terminal of clock generator 19 is not asserted or deasserted, clock generator 19 is disabled, i.e., the output terminal of clock generator 19 is disabled. When clock generator 19 is disabled, a logic low voltage is transmitted to the clock input terminal of DAC 17, i.e., signal CLOCK is stopped. The control input terminal of clock generator 19 is asserted when signal CONTROL is at a logic low voltage. Conversely, the control input terminal of clock generator 19 is not asserted when signal CONTROL is at a logic high voltage. A logic low voltage can be, for example, zero volts and can be defined to be a logic zero. A logic high voltage can be, for example, five volts and can be defined to be a logic one. It should be understood that the definition of logic zero and logic one is a matter of choice. In other words, a logic one can be defined as zero volts and a logic zero can be defined to be five volts.

Sigma-delta modulator 16 can be a conventional sigma-delta modulator implemented using summing devices, multipliers, and delay elements. Clock control circuit 18 can be implemented using a delay element such as, for example, a memory element or latch, coupled to a summing device such as, for example, an adder. By way of example, since signal ONE BIT DATA is a single-bit digital signal, clock control circuit 18 is implemented using a D-type flip-flop 21 connected to an exclusive-OR (XOR) gate 22.

Flip-flop 21 has a data input terminal labeled D commonly connected to the data input terminal of clock control circuit 18 and to the first input terminal of XOR gate 22, a clock input terminal labeled CK connected to the clock input terminal of clock control circuit 18, and a true output terminal labeled Q connected to the second input terminal of XOR gate 22. The output terminal of XOR gate 22 is connected to the output terminal of clock control circuit 18.

Data converter 10 is preferably implemented with Complementary Metal-Oxide Semiconductor (CMOS) logic circuitry, which has relatively low power consumption and relatively high speed, but may be implemented in other transistor technologies as well.

Figure 2:
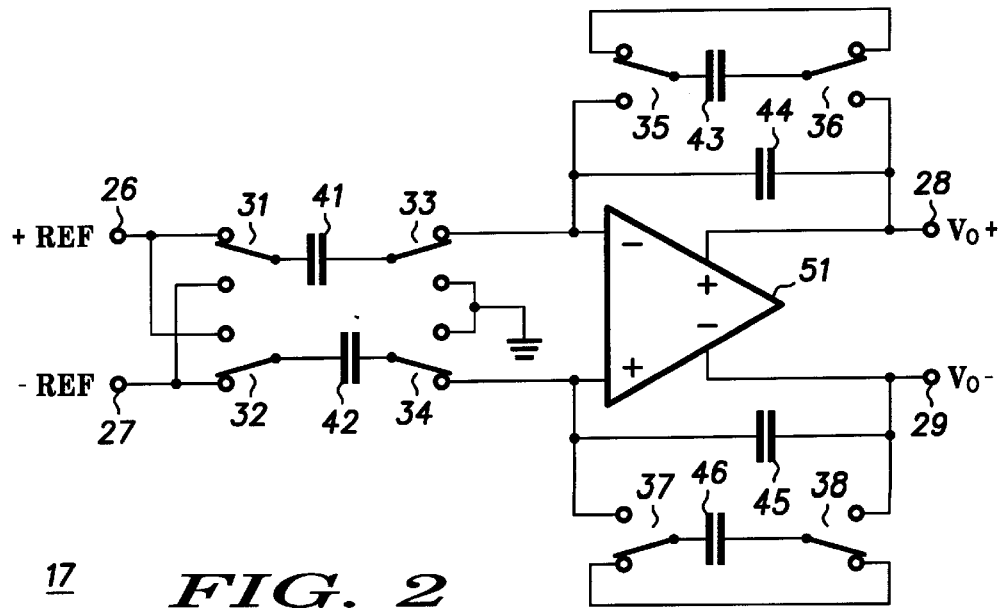
FIG. 2 shows a switched capacitor implementation of a Digital-to-Analog Converter (DAC) of the data converter of FIG. 1.

FIG. 2 shows a switched capacitor implementation of DAC 17 (FIG. 1). In this example, DAC 17 is implemented using a switched capacitor circuit that includes switches 31–38, capacitors 41–46, and an amplifier 51. Further, DAC 17 has input terminals 26 and 27 for receiving reference signals +REF and −REF, respectively, and output terminals 28 and 29 for providing signals Vo+ and Vo−, respectively. The differential output signal developed at output terminals 28 and 29 of DAC 17, i.e., signal Vo+−Vo−, is transmitted to output terminal 12 (FIG. 1) to provide signal OUTPUT.

Referring to FIGS. 1 and 2, in operation, data converter 10 converts a multibit digital signal, i.e., signal MULTIBIT DATA, to an analog signal, i.e., signal OUTPUT. More particularly, sigma-delta modulator 16 converts digital signal MULTIBIT DATA to digital signal ONE BIT DATA. During the generation of signal ONE BIT DATA, sigma-delta modulator 16 generates noise, such as quantization noise, which appears in signal OUTPUT at a frequency approximately equal to one-half of the frequency of signal SAMPLING CLOCK.

Clock control circuit 18 enables or disables clock generator 19 in accordance with signal ONE BIT DATA to attenuate noise in signal OUTPUT. When signal ONE BIT DATA alternates between two logic levels during two consecutive clock cycles of signal SAMPLING CLOCK, signal CONTROL is at a logic high voltage. Thus, the output terminal of clock generator 19 is disabled and a logic low voltage is transmitted from the output terminal of clock generator 19 to the clock input terminal of DAC 17. When signal ONE BIT DATA remains at the same logic level during two consecutive clock cycles of signal SAMPLING CLOCK, signal CONTROL is at logic low voltage. Therefore, the output terminal of clock generator 19 is enabled and a clock signal is transmitted from the output terminal of clock generator 19 to the clock input terminal of DAC 17.

Switches 35–38 of DAC 17 are switched continuously during operation. Switches 31, 32, 33, and 34 are switched while signal CONTROL is at a logic low voltage, i.e., while a clock signal is transmitted from clock generator 19 to DAC 17. Further, the two phases of a control signal (not shown), which controls switches 31–34, are determined by signal ONE BIT DATA.

Figure 3:
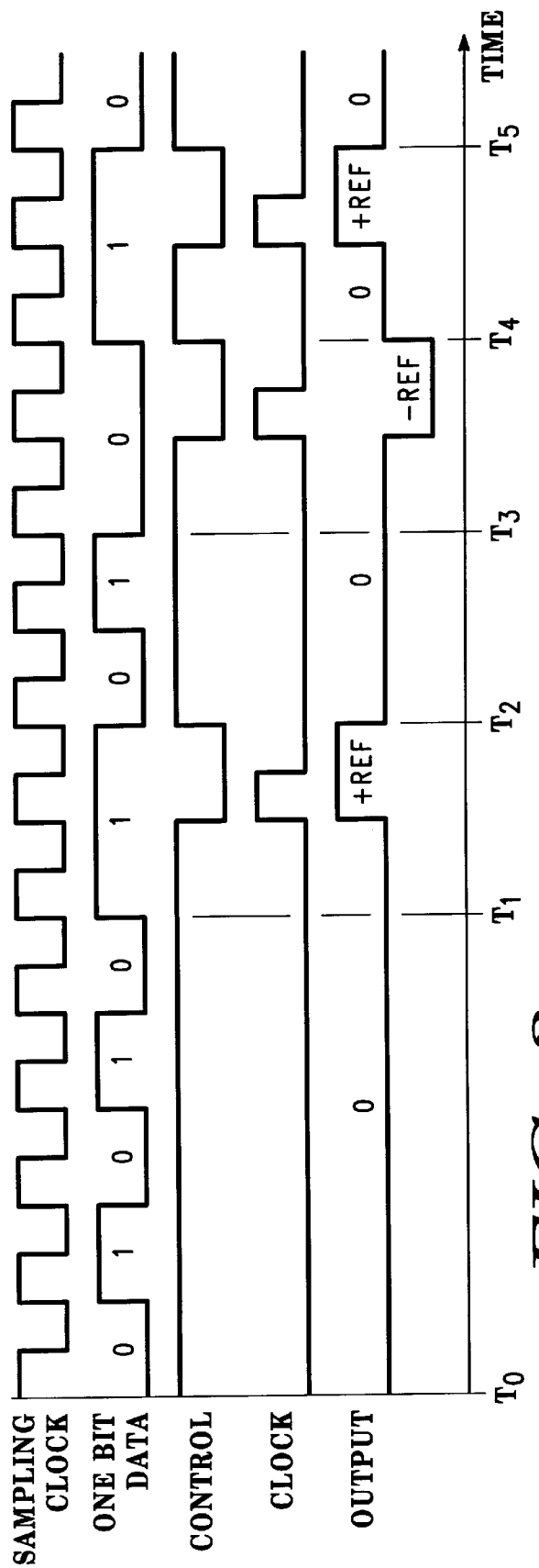
FIG. 3 is a timing diagram illustrating the signals of the data converter of FIG. 1.

The operation of data converter 10 is further described with reference to FIG. 3. FIG. 3 is a timing diagram illustrating the signals of data converter 10 (FIG. 1). For purposes of clarity, all of the signals of data converter 10 are not shown in the timing diagram of FIG. 3. Signal ONE BIT DATA is a single-bit digital signal having a logic value of either logic zero (labeled 0 in FIG. 3) or logic one (labeled 1 in FIG. 3). Signal OUTPUT is a trinary signal, i.e., a signal having three levels, which are labeled +REF, 0, and −REF in FIG. 3. Signal SAMPLING CLOCK has a frequency of Fs.

DAC 17 generates signal OUTPUT by processing signals ONE BIT DATA and CLOCK. Signal OUTPUT is at level +REF when signal ONE BIT DATA is at a logic high voltage for two consecutive clock cycles of signal SAMPLING CLOCK and signal OUTPUT is at level −REF when signal ONE BIT DATA is at a logic low voltage for two consecutive clock cycles. Signal OUTPUT is at level 0 when signal ONE BIT DATA alternates between a logic high voltage and a logic low voltage between two consecutive clock cycles of signal SAMPLING CLOCK.

Clock control circuit 18 processes signal ONE BIT DATA and generates signal CONTROL to control signal CLOCK, which is transmitted to DAC 17 by clock generator 19. High frequency quantization noise is present in signal ONE BIT DATA when it alternates between a logic zero and logic one during two consecutive clock cycles of signal SAMPLING CLOCK. In accordance with the present invention, clock control circuit 18 stops the digital to analog conversion process in DAC 17 by stopping the clock signal provided to DAC 17 when signal ONE BIT DATA alternates between a logic zero and a logic one during two consecutive clock cycles of signal SAMPLING CLOCK. In other words, the digital to analog conversion process performed by DAC 17 is disabled by preventing the transmission of a clock signal from clock generator 19 to DAC 17. This attenuates the energy in signal OUTPUT at a frequency approximately equal to Fs/2, thereby attenuating the quantization noise in signal OUTPUT at Fs/2. The digital to analog process of DAC 17 is enabled when signal ONE BIT DATA remains at the same logic level for two consecutive clock cycles of signal SAMPLING CLOCK. In other words, the digital to analog conversion process performed by DAC 17 is enabled by enabling the transmission of the clock signal from clock generator 19 to DAC 17. Thus, a clock signal is transmitted to the clock input terminal of DAC 17, one or more pulses are transmitted to DAC 17 from clock generator 19.

Referring to FIGS. 1 and 3, between times $T_0$ and $T_1$, signal ONE BIT DATA alternates between a logic zero and a logic one at a frequency of Fs/2 and signal CONTROL is at a logic high voltage. When signal CONTROL is at a logic high voltage, the output terminal of clock generator 19 is disabled and signal CLOCK is at a logic low voltage. Signal OUTPUT is at level 0 between times $T_0$ and $T_1$.

Between times $T_1$ and $T_2$, signal ONE BIT DATA is a logic one for two consecutive cycles of signal SAMPLING CLOCK and signal CONTROL transitions from a logic high voltage to a logic low voltage, thereby enabling the output terminal of clock generator 19. In other words, the clock signal provided to DAC 17 is enabled. Signal OUTPUT transitions to level +REF from level 0 since signal ONE BIT DATA is a logic one for two consecutive cycles of signal SAMPLING CLOCK.

Between times $T_2$ and $T_3$, signal ONE BIT DATA alternates between a logic zero and a logic one during consecutive clock cycles of signal SAMPLING CLOCK and signal CONTROL is at a logic high voltage. When signal CONTROL is at a logic high voltage, the output terminal of clock generator 19 is disabled and signal CLOCK is at a logic low voltage. In other words, the clock signal provided to DAC 17 is stopped. Signal OUTPUT is at level 0 since signal ONE BIT DATA alternates between a logic zero and a logic one for consecutive cycles of signal SAMPLING CLOCK.

Between times $T_3$ and $T_4$, signal ONE BIT DATA is at a logic zero for two consecutive cycles of signal SAMPLING CLOCK and signal CONTROL transitions from a logic high voltage to a logic low voltage, thereby enabling the output terminal of clock generator 19. Signal OUTPUT transitions to level –REF from level 0.

Between times $T_4$ and $T_5$, signal ONE BIT DATA is at a logic one for two consecutive cycles of signal SAMPLING CLOCK. Signal CONTROL transitions from a logic high voltage to a logic low voltage. Signal OUTPUT transitions from level 0 to level +REF.

Figure 4:
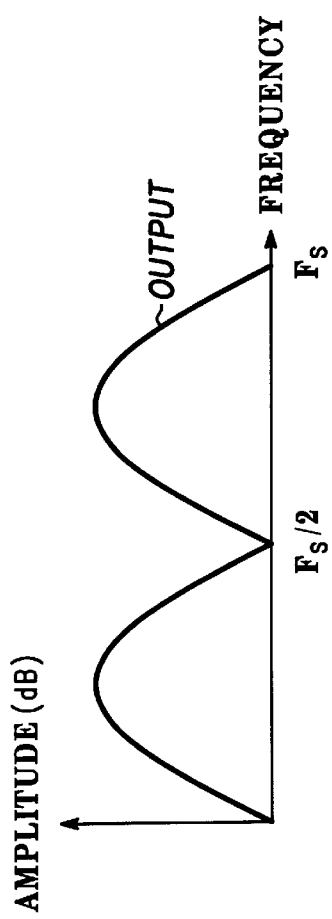
FIG. 4 is a graph of the noise present in an output signal of the data converter of FIG. 1 in the frequency domain.

FIG. 4 is a graph of the quantization noise present in signal OUTPUT of data converter 10 (FIG. 1) in the frequency domain. The horizontal axis represents frequency, and the vertical axis represents the amplitude of signal OUTPUT in decibels (dB). As is shown in FIG. 4, the noise present in signal OUTPUT has a notch characteristic at Fs/2, which is one-half the frequency of signal SAMPLING CLOCK. In other words, data converter 10 of FIG. 1 provides a sin(x)/(x) frequency response at Fs/2. The notch characteristic is a result of stopping the clock signal provided to DAC 17 in accordance with signal ONE BIT DATA as described hereinbefore. By attenuating signal OUTPUT at Fs/2, data converter 10 attenuates noise in signal OUTPUT appearing at a frequency equal to approximately Fs/2, thereby increasing the Signal-to-Noise Ratio (SNR) of data converter 10.

By now it should be appreciated that a data converter circuit and a method for attenuating noise in an output signal generated by the data converter have been provided. An advantage of the present invention is that it uses a simple clock control circuit and single-bit DAC for attenuating noise in the output signal. The simple clock control circuit allows the use of a single-bit DAC for the filtering of pattern noise around Fs/2 without increasing the word size to the DAC. In addition, the present invention provides a data converter circuit and method for generating a trinary signal by stopping the clock of a DAC of the data converter circuit.

What is claimed is:

1. A circuit for converting a digital signal to an analog signal, comprising:
 a converter having a data input coupled for receiving the digital signal and an output for providing the analog signal converted from the digital signal in response to a clock signal;
 a clock generator having an output for providing the clock signal to a clock input of the converter; and
 a control circuit having an input coupled for receiving the digital signal and an output coupled to an input of the clock generator for enabling the clock signal to the converter.

2. The circuit of claim 1, further comprising a sigma-delta modulator having an input for receiving a second digital signal and an output coupled to the input of the control circuit and further coupled to the data input of the converter.

3. The circuit of claim 1, wherein the converter is a single-bit Digital-to-Analog Converter (DAC).

4. The circuit of claim 1, wherein the converter includes a switched capacitor circuit having an input coupled for receiving the digital signal and an output coupled for providing the analog signal.

5. The circuit of claim 1, wherein the control circuit comprises:
 a logic gate having a first input coupled for receiving the digital signal and an output coupled to the input of the clock generator; and
 a memory element having a first input coupled for receiving the digital signal and an output coupled to a second input of the logic gate.

6. The circuit of claim 5, wherein the logic gate is an exclusive-OR (XOR) gate and the memory element is a D-type flip-flop.

7. A method for attenuating noise in an output signal of a data converter that converts a digital signal to an analog signal, comprising the steps of:
 attenuating energy in the output signal at a predetermined frequency, wherein the step of attenuating includes the steps of,
 disabling a digital to analog conversion process of the data converter when the digital signal alternates between first and second logic levels during two consecutive cycles of a sampling clock of the data converter, and
 enabling the digital to analog conversion process when the digital signal remains at the first logic level for two consecutive cycles of the sampling clock.

8. The method of claim 7, wherein the step of disabling a digital to analog conversion process includes disabling a clock generator of the data converter when the digital signal alternates between the first and second logic levels during two consecutive cycles of the sampling clock.

9. The method of claim 8, wherein the step of disabling a clock generator includes disabling an output terminal of the clock generator so that the output terminal provides a first logic signal to a digital-to-analog converter of the data converter.

10. The method of claim 7, wherein the step of disabling a digital to analog conversion process includes preventing the transmission of a clock signal to a digital-to-analog converter of the data converter.

11. The method of claim 7, wherein the predetermined frequency is a frequency equal to approximately one-half of the frequency of the sampling clock.

12. The method of claim 7, wherein the digital signal is a one-bit signal and further including the step of generating the digital signal from a multibit digital signal.

13. The method of claim 7, wherein the step of enabling a digital to analog conversion process includes enabling a clock generator of the data converter when the digital signal remains at the first logic level for two consecutive cycles of the sampling clock.

14. The method of claim 7, wherein the step of enabling the digital to analog conversion process includes providing a clock signal to a digital-to-analog converter of the data converter when the digital signal remains at the first logic level for two consecutive cycles of the sampling clock.

15. A method for generating a trinary signal, comprising the steps of:

converting a digital signal to the trinary signal using a clock signal, wherein the step of converting includes the steps of,
    disabling the clock signal when the digital signal alternates between first and second logic levels during two consecutive cycles of a sampling clock, and
    enabling the clock signal when the digital signal remains at the first logic level for two consecutive cycles of the sampling clock.

16. The method of claim 15, wherein the step of disabling the clock signal includes providing a first logic signal for the clock signal.

17. The method of claim 15, wherein the step of enabling the clock signal includes providing a pulse for the clock signal.

18. The method of claim 15, wherein the step of converting a digital signal to the trinary signal using a clock signal includes the steps of:
    transitioning the trinary signal to a first level from a second level when the digital signal is at the first logic level and the clock signal is enabled; and
    transitioning the trinary signal to a third level from the second level when the digital signal is at the second logic level and the clock signal is enabled.

19. The method of claim 15, wherein the step of converting includes attenuating the energy of the trinary signal at a predetermined frequency to generate a sin(x)/(x) frequency response at the predetermined frequency.

* * * * *